(12) United States Patent
Hilscher et al.

(10) Patent No.: US 6,922,088 B2
(45) Date of Patent: Jul. 26, 2005

(54) SELF-DETERMINING ELECTRONIC CONTROL CIRCUIT

(75) Inventors: Alexander Hilscher, Kronberg (DE); Matthias Schiebahn, Bad Camberg (DE)

(73) Assignee: Braun GmbH, Kronberg (DE)

( * ) Notice: Subject to any disclaimer, the term of this patent is extended or adjusted under 35 U.S.C. 154(b) by 0 days.

(21) Appl. No.: 10/434,600

(22) Filed: May 9, 2003

(65) Prior Publication Data

US 2004/0029313 A1 Feb. 12, 2004

(30) Foreign Application Priority Data

May 11, 2002 (DE) .......................................... 102 21 088

(51) Int. Cl.[7] .............................................. H03K 17/00
(52) U.S. Cl. .......................................... 327/100; 326/38
(58) Field of Search ..................... 327/99, 100; 326/37, 326/38

(56) References Cited

U.S. PATENT DOCUMENTS

| | | | | |
|---|---|---|---|---|
| 6,201,380 B1 | * | 3/2001 | Tsujino et al. | ............... 323/313 |
| 6,343,048 B1 | * | 1/2002 | Jung | ........................... 365/233 |

FOREIGN PATENT DOCUMENTS

| | | |
|---|---|---|
| DE | 960 06 047 | 11/1994 |
| DE | 197 32 960 | 10/1999 |
| DE | 694 27 487 | 4/2002 |
| EP | 0 055 573 | 12/1981 |

* cited by examiner

Primary Examiner—Kenneth B. Wells
(74) Attorney, Agent, or Firm—Fish & Richardson P.C.

(57) ABSTRACT

A self-determining control circuit is configured to assume one of several states depending upon the interconnections of its input and output terminals. The self-determining circuit is enabled to sense which, if any, of its input and output have been interconnected and assume its proper state of operation. For example, a self-determining integrated circuit may have four input terminals (e.g., terminals 1, 2, 3, 4) and four output terminals (e.g., terminals A, B, C, D). The circuit may sense that a particular input terminal is directly connected with a particular output terminal (e.g., input terminal 2 is shorted to output terminal D) and operate under one set of parameters. If, however, the control circuit senses that a different set of terminals are interconnected (e.g., input terminal 4 with output terminal B), then the control circuit may operation under a different set of parameters. Similarly, if the control circuit senses that none of the terminals are interconnected (or connected to a supply potential), then it may operate under yet a different set of parameters.

15 Claims, 2 Drawing Sheets

US 6,922,088 B2

SELF-DETERMINING ELECTRONIC CONTROL CIRCUIT

CROSS REFERENCE TO RELATED APPLICATION

This application claims priority to German Patent Application No. DE 102 21 088.8, filed May 11, 2002, which is incorporated herein by reference in its entirety.

TECHNICAL FIELD

This invention relates to electronic control devices and circuits.

BACKGROUND

A self-determining control circuit is generally one in which the circuit can automatically determine its state of operation and perform control operations accordingly. For example, U.S. Pat. No. 6,188,273 describes an integrated circuit that includes a contact-making point for selecting an operating mode of the integrated circuit. The contact-making point can be connected to one of two different supply potentials. The integrated circuit has a control device that is connected to the contact-making point that identifies which of the two supply potentials the contact-making point is connected and generates a corresponding operating signal.

If an electronic control circuit is to be able to assume more than two operating modes, however, it typically includes either further inputs for selecting the operating mode, for example as described in U.S. Pat. No. 6,157,051, or more than two supply potentials must be provided. The addition of inputs or power supply potentials may add size or cost to the circuit.

It is one object of the present invention to provide a self-determining electronic circuit that can assume several different states, or can permit several different operating modes, depending on the interconnection (or lack thereof) of at least one input with at least one output of the circuit. Such a circuit is thus enabled to assume two or more operating modes without the provision of additional inputs or power supply potentials.

SUMMARY

In one aspect, the invention features a circuit configured to operate in a number of different states that has an input terminal for selecting a state and an output terminal. The circuit also includes a comparator that compares a signal present at the input terminal with a characteristic signal output at the output terminal. The circuit is configured to operate in a first state if the comparator produces a signal that indicates that the first characteristic signal is present at the input terminal.

Embodiments may include one or more of the following features. The circuit may include another output terminal and another comparator that compares a signal present at the input terminal with a second characteristic signal output by the circuit at the second output terminal. The circuit may be configured to operate in a second state if the second comparator produces a signal that indicates that the second characteristic signal is present at the input terminal.

The circuit may include a number of input terminals for selecting a state, output terminals and comparators. The comparators compare signals present at the input terminals with unique characteristic signals output by the circuit at each output terminal, and the circuit operates in one of the several states depending upon the results of the comparators.

The circuit may also include a second comparator that compares a signal present at the input terminal with a power supply potential. The circuit may be configured to operate in a first state if the comparator produces a signal that indicates the power supply potential is at a first voltage and operates in a second state if the signal indicated the power supply potential is at a second voltage.

The characteristic signal output by the circuit may be a digital signal corresponding to a predetermined bit pattern. The circuit may compare a signal present at the input terminal with a characteristic signal output by the circuit at the first output terminal upon the circuit being powered up. After comparing the signal present at the input terminal with the characteristic signal output by the circuit, the circuit may use the input and output terminal for inputting and outputting signals than characteristic signal used for setting the state of the circuit. The circuit may be in the form of an application specific integrated circuit.

In another aspect, the invention features an electronic device that includes a circuit board, a motor operably connected to the circuit board, and a circuit operably connected to the circuit board. The circuit is configured to assume one of several selectable states and controls the operation of the motor according to parameters associated with the state assumed by the circuit. The circuit includes at least one input terminal for selecting a state, at least one output terminal, and a comparator that compares a signal present at the input with a characteristic signal output by the circuit at its output terminal. The circuit operates in one of its states if the comparator produces a signal that indicates that the characteristic signal is present at the input terminal.

Embodiments may include one or more of the following features. The electronic device may be an electric toothbrush that includes a set of bristles and operably controlled by the motor. The circuit of the electronic device may include another output terminal and a second comparator that compares signal present at the input terminal with a second characteristic signal output by the circuit at the second output terminal. The circuit may operate in a different one of its states if the second comparator produces a signal that indicates that the second characteristic signal is present at the input terminal. The circuit may also include a second comparator that compares a signal present at the input terminal with a power supply potential, and the circuit may operate in a different one of its states if the second comparator produces a signal that indicates that a power supply potential at a first voltage is present at the input terminal.

In another aspect, the invention features a method of producing a line of similar products that includes providing multiple copies of an integrated circuit in the form of a set of identical microchips, placing one of the microchips in each of a number of different circuit boards, and including the circuit boards in respective models of the line of personal care appliances. The different circuit boards includes a first circuit board that has a first arrangement of connections between inputs and outputs of the microchip for controlling one model of the line of products in a desired mode, and a second circuit board that has a second arrangement of connections between inputs and outputs of the microchip for controlling another model of the line of products in a desired mode. The circuit provides an output responsive to a sensed arrangement of connections between inputs and outputs.

Embodiments may include one or more of the following features. The line of products may be a line of electric toothbrushes. The line of products may include a load, and the microchip may produce a load control output that is a function of connections within the circuit board between the microchip's inputs and outputs. Each product in the line of products may include a Light Emitting Diode (LED) that the microchip controls as a function of connections within the circuit board between the microchip's inputs and outputs.

The details of one or more embodiments of the invention are set forth in the accompanying drawings and the description below. Other features, objects, and advantages of the invention will be apparent from the description and drawings, and firm the claims.

DESCRIPTION OF DRAWINGS

Like reference symbols in the various drawings indicate like elements.

DETAILED DESCRIPTION

A self-determining electronic control circuit, such as an Application Specific Integrated Circuit (ASIC), may assume one of several different operating states based on the interconnection between the input and output terminals of the control circuit. For example, a control circuit may have four input terminals (e.g., terminals 1, 2, 3, 4) and four output terminals (e.g., terminals A, B, C, D). The control circuit may sense that a particular input terminal is directly connected with a particular output terminal (e.g., input terminal 2 is shorted to output terminal D) and operate under one set of parameters. If, however, the control circuit senses that a different set of terminals are interconnected (e.g., input terminal 4 with output terminal B), then the control circuit may operation under a different set of parameters. Similarly, if the control circuit senses that none of the terminals are interconnected, then it may operate under yet a different set of parameters.

Figure 1:
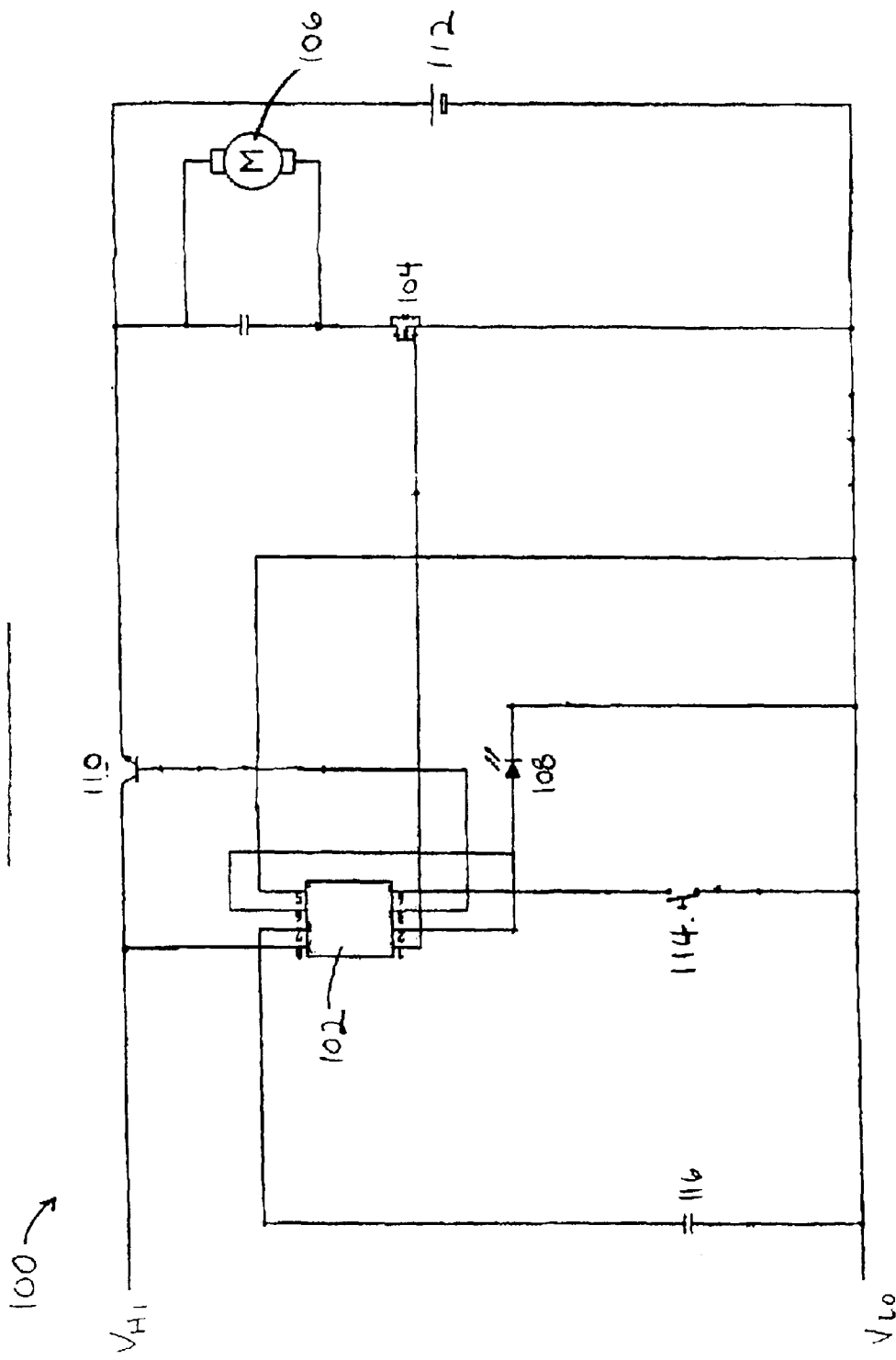
FIG. 1 is a circuit diagram of a self-determining ASIC inserted within a motor control board for an electric toothbrush.

In an exemplary embodiment, a single, self-determining ASIC is designed for used in product line of electric toothbrushes. The product line includes five different types of electric toothbrushes, each with a different set of control parameters. For example, as shown in FIG. 1, a self-determining ASIC 102 is in the form of an 8-pin chip is plugged into a corresponding socket in a toothbrush motor control circuit board 100. The toothbrush motor control circuit board 100 is specific for one of the types of electric toothbrushes. When ASIC 102 is inserted into the motor control circuit board 100 and power is applied, ASIC 102 automatically identifies the type of toothbrush in which it is installed by the configuration of the connections established between its inputs and outputs through the circuit board. Once the toothbrush type is identified, ASIC 102 controls various features provided on the circuit board (e.g., motor speed, LED illumination, automatic shut-off timer control) according to a set of predetermined parameters for the identified toothbrush type.

ASIC 102 includes eight pins (labeled 1–8). Pin 1 is connected to switch 104 (in this case a MOSFET) and controls the speed of motor 106 by varying the duty cycle for the motor. Pin 2 is collected to Light Emitting Diode (LED) 108 and controls the operation of LED 108. Pin 3 is connected to switch 110 (in this case a bipolar junction transistor) and controls the recharging of rechargeable battery 112. Pin 4 is connected to switch 114, which is controlled by the user to turn the toothbrush on and off as well as to vary motor speed. Pin 5 is connected to a low voltage source $V_{LO}$ and provides a low voltage DC power source for the ASIC 102. Pin 6 is the only input to ASIC 112 and, in this example, is directly connected with pin 2, and, as will be explained in more detail below, identifies the operating state of the ASIC 102. Pin 7 is connected to capacitor 116 and pin 8 is connected to a high voltage source $V_{HI}$.

The toothbrush motor control circuit board 100 may be one of five types corresponding to one of the five different types of toothbrushes in the line. Each toothbrush motor control circuit board requires a different set of control parameters and ASIC 102 is configured to control the operation of any one of the five types. Additionally, ASIC 102 is configured to automatically identify which of the five types of motor control circuit boards into which it has been inserted by sensing the configuration of the connections established between its inputs and outputs through the circuit board. In this case, the interconnection between pin 6 and other terminals is the connection that determines the state of operation. Thus, if ASIC 102 senses that pin 6 is directly connected with pin 2 as shown in FIG. 1, the ASIC 102 identifies that the motor control board 100 provides for two motor speeds and LED 108 that should flash when battery 108 is recharging and remain solid with battery 112 is fully recharged. If, however, ASIC 102 senses that pin 6 is interconnected with pin 3, for example, then ASIC 102 identifies a different type of motor control board that provides for only one motor speed and LED 108 should illuminate when battery 112 is recharging, but otherwise should remain off. Thus, by designing a circuit such as ASIC 102, a manufacturer may design, produce and stock a single circuit that may be easily incorporated in a family of products (e.g., a series of different electric toothbrush types) or even different types of products (e.g, an electric toothbrush and an electric razor), which may reduce cost and manufacturing errors associated with having different control circuits designed for different products.

While the illustrated embodiment shows the operation and control of an electric toothbrush, it should be understood that the application of the teaching of this patent may find application in a wide range of electronics products.

Figure 2:
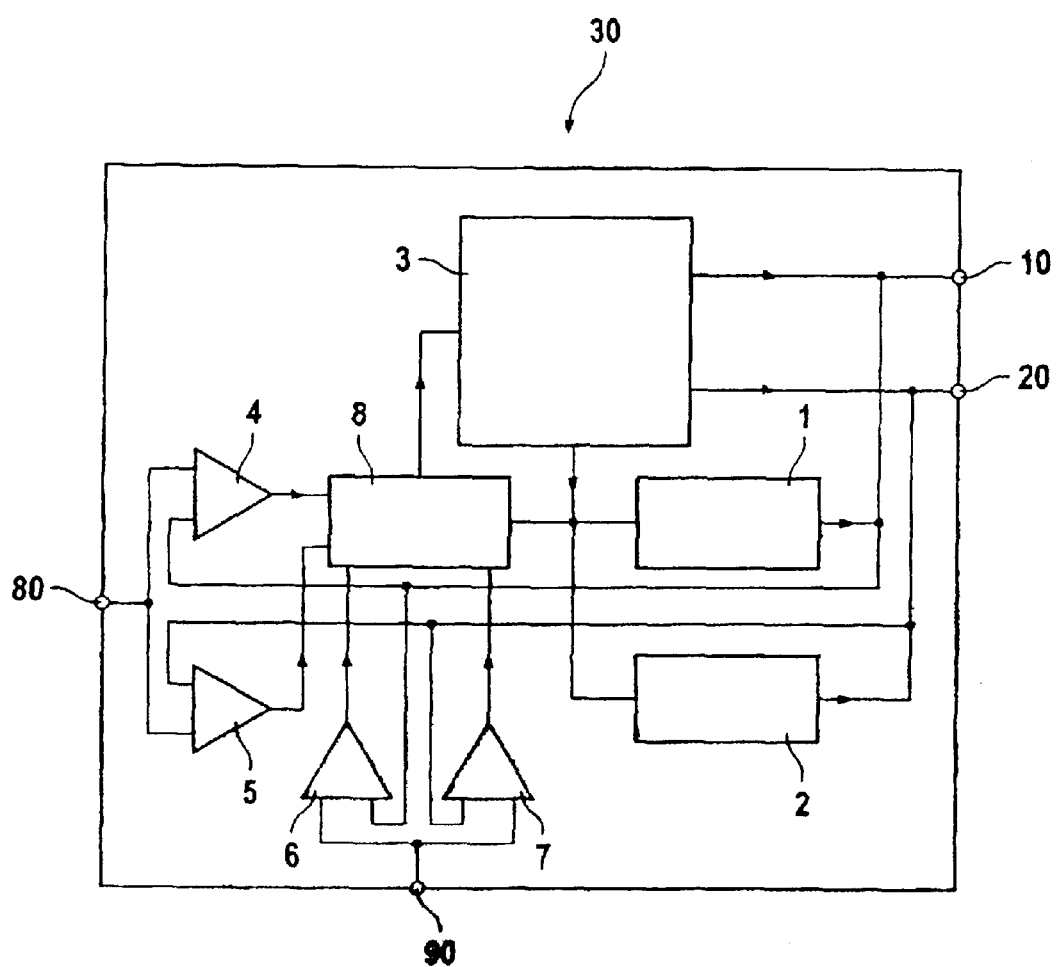
FIG. 2 is a diagram of a self-determining circuit with two inputs and two outputs.

FIG. 2 illustrates the configuration of a self-determining control circuit 30. Self-determining control circuit 30 includes two inputs (80, 90), two outputs (10, 20), a first control circuit 3, a second control circuit 8, and four comparators 4, 5, 6, 7. Self-determining control circuit 30 also includes a first memory device 1 and a second memory device 2, which each store information for generating a unique test signal. In a digital implementation, for example, the first memory device 1 may store a four-bit pattern (e.g., "0001") and second memory device may store a different four-bit pattern (e.g., "1100"), each of which may be used to generate a clock-driven digital signal corresponding to the bit pattern. As will be explained in more detail below, these test signals stored in memory devices 1 and 2 are used by the self-determining control circuit 30 to identify its proper state of operation.

The first input 80 of self-determining control circuit 30 is connected to one input of both comparator 4 and 5. The other input of comparator 4 is connected to the output of first memory device 1, and the other input of the comparator 5 is connected to the output of the second memory 2.

The other input 90 of self-determining control circuit 30 is connected to one input of comparators 6 and 7. The other input of the comparator 6 is connected to the output of first memory device 1, while the other input of comparator 7 is connected to the output of second memory device 2.

The output of each of the comparators, 4, 5, 6, 7, are connected to the input of the first control circuit 3. The first control circuit 3 includes three outputs, two of which are tied to the outputs, 10, 20, of the self-determining control circuit 30. The third output of first control circuit 3 is connected to the input of the second control circuit 8, first memory device 1, and second memory device 2.

In operation, self-determining control circuit 30 enters an initialization phase when it is initially plugged into a circuit board or powered up. During this initialization phase, the first control circuit 3 accesses memory device 1 and propagates a test signal derived from the information contained in memory device 1 to output 10. Similarly, the first control circuit 3 accesses memory device 2 and propagates a different test signal derived from the information in memory device 2 to output 20. Because the outputs 10, 20 are tied to the inputs of the comparators, these test signals are also fed into the inputs of comparators 4, 5, 6 and 7. The comparators 4, 5, 6, and 7 determine if one or more of the outputs 10, 20 are connected to one or more of the inputs by comparing the test signal generated at the output and the signal received at the input. The second control circuit 8 places the self-determining control circuit 30 into its proper state based on the output of the comparators 4, 5, 6, and 7. For example, if the comparators indicate that output 10 is connected to input 90, then the second control circuit may set the self-determining control circuit 30 in a first state of operation, whereas if the comparators indicate that output 10 is connected to input 80, then the second control circuit may set the self-determining control circuit in a second state of operation. The second control circuit 8 may set the desired state by, for example, setting a series of flag bits which control a series of branch instructions in a program stored in the self-determining circuit 30 or activating and deactivating of a series of switches within the self-determining circuit 30.

After the self-determining control circuit 30 has identified its proper state of operation, the initialization phase is complete and the self-determining control circuit begins normal operation for the particular state it has identified. Once normal operations have begun, the input and output terminals of the self-determining control circuit 30 may be used for receiving and sending signals used to carry out the various functions of the circuit.

In another embodiment, a self-determining control circuit includes an additional comparator for each input in order to compare the inputs with L supply potentials. The outputs of these additional comparators are also connected to a control circuit. These additional comparators thus detect whether the inputs coupled to a supply potential and/or outputs. This additional set of comparators permits the self-determining control circuit to be configured for an even greater number of states. For example, if the electronic circuitry comprises N inputs and M outputs, and if L supply potentials are available, then $(L+M)^N$ different states can be set.

A number of embodiments of the invention have been described. Nevertheless, it will be understood that various modifications may be made without departing from the spirit and scope of the invention. For example, a self-determining control circuit need not be in the form an ASIC as illustrated in FIG. 1, but may be in the form of a microcontroller or a set of discrete components. Accordingly, other embodiments are within the scope of the following claims.

What is claimed is:

1. A circuit configured to operate in a number of different states, the circuit comprising:

a control circuit for setting the state of the circuit;

a first input terminal;

a first output terminal; and a first comparator that compares a signal present at the first input terminal with a first characteristic signal output by the circuit at the first output terminal, said first comparator being connected to said control circuit, wherein the circuit operates in a first state if the comparator produces a signal that indicates that the first characteristic signal is present at the first input terminal.

2. The circuit of claim 1 further comprising:

a second output terminal; and a second comparator that compares a signal present at the first input terminal with a second characteristic signal output by the circuit at the second output terminal, said second comparator being connected to said control circuit, wherein the circuit operates in a second state if the second comparator produces a signal that indicates that the second characteristic signal is present at the first input terminal.

3. The circuit of claim 1 comprising:

a plurality of input terminals;

a plurality of output terminals;

a plurality of comparators that compare a signal present at the input terminals with unique characteristic signals output by the circuit at each output terminal, said comparators being connected to said control circuit, wherein the circuit operates in one of the different states depending upon the results of the comparators.

4. The circuit of claim 1 wherein the characteristic signal comprises a first or a second supply potential.

5. The circuit of claim 1 wherein the characteristic signal comprises a digital signal corresponding to a predetermined bit pattern.

6. The circuit of claim 1 wherein the comparator compares a signal present at the input terminal with a first characteristic signal output by the circuit at the first output terminal upon the circuit being powered up.

7. The circuit of claim 6, wherein the circuit uses the input terminal and output terminal for inputting or outputting signals other than the first characteristic signal used for setting the state of the circuit.

8. The circuit of claim 1, wherein the circuit is an application specific integrated circuit.

9. The circuit of claim 1 further comprising:

a second input terminal; and a third comparator that compares a signal present at the second input terminal with said first characteristic signal output by the circuit at the first output terminal, said third comparator being connected to said control circuit, wherein the circuit operates in the second state if the third comparator produces a signal that indicates that the first characteristic signal is present at the second input terminal.

10. An electronic device comprising:

a circuit board;

a load operably connected to the circuit board; and a circuit operably connected to the circuit board, wherein the circuit assumes one of a number of different selectable states and controls the operation of the load according to parameters associated with the state assumed by the circuit, the circuit comprising:

a control circuit for setting the state of the circuit at least one input terminal;

at least one output terminal;

at least one comparator that compares a signal present at the input terminal with a characteristic signal output by the circuit at its output terminal, said comparator being connected to said control circuit wherein the circuit operates in one of its different states if the comparator produces a signal that indicates that the characteristic signal is present at the input terminal.

11. The electronic device of claim 10 further comprising:

a set of bristles, and wherein the load is a motor which is operably connected to the bristles to move the bristles.

12. The electronic device of claim 10, wherein the circuit further comprises:

a second output terminal; and a second comparator that compares the signal present at the input terminal with a second characteristic signal output by the circuit at the second output terminal, said second comparator being connected to said control circuit, wherein the circuit operates in a different one of its different states if the second comparator produces a signal that indicates that the second characteristic signal is present at the input terminal.

13. The electronic device of claim 10, wherein the characteristic signal comprises a first or a second supply potential.

14. The electronic device of claim 10, wherein the circuit further comprises:

a second input terminal; and a third comparator that compares a signal present at the second input terminal with said characteristic signal output by the circuit at the output terminal, said third comparator being connected to said control circuit, wherein the circuit operates in a different one of its different states if the third comparator produces a signal that indicates that the characteristic signal is present at the second input terminal.

15. The electronic device of claim 10, wherein the characteristic signal comprises a digital signal corresponding to a predetermined bit pattern.

* * * * *